US007839003B2

(12) United States Patent
Hamada et al.

(10) Patent No.: US 7,839,003 B2
(45) Date of Patent: Nov. 23, 2010

(54) SEMICONDUCTOR DEVICE INCLUDING A COUPLING CONDUCTOR HAVING A CONCAVE AND CONVEX

(75) Inventors: Mitsuhiro Hamada, Hyogo (JP); Kouichi Tomita, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/183,887

(22) Filed: Jul. 31, 2008

(65) Prior Publication Data
US 2009/0065910 A1    Mar. 12, 2009

(30) Foreign Application Priority Data
Jul. 31, 2007    (JP)    ............ P. 2007-199692

(51) Int. Cl.
*H01L 23/52* (2006.01)
(52) U.S. Cl. ............ 257/784; 257/666; 257/667; 257/668; 257/669; 257/670; 257/671; 257/672; 257/673; 257/674; 257/675; 257/676; 257/677; 257/734; 257/739; 257/748; 257/750; 257/762; 257/765; 257/775; 257/781; 257/E23.079; 257/E23.153; 438/123; 438/614
(58) Field of Classification Search ......... 257/666–677, 257/734, 739, 748, 750, 762, 765, 775, 781, 257/784, 735, 736, 741, 747, 753, 786, E23.079, 257/E23.153; 438/123, 614
See application file for complete search history.

(56) References Cited

U.S. PATENT DOCUMENTS

| RE35,119 E | * | 12/1995 | Blonder et al. | ............... 257/739 |
| 6,849,930 B2 | * | 2/2005 | Nakajima et al. | ........... 257/666 |
| 2004/0135237 A1 | * | 7/2004 | Funato et al. | ............... 257/673 |
| 2004/0217488 A1 | * | 11/2004 | Luechinger | ................. 257/784 |
| 2007/0040250 A1 | * | 2/2007 | Kajiwara et al. | ............ 257/673 |
| 2007/0187819 A1 | * | 8/2007 | Nakajima | ................... 257/734 |

FOREIGN PATENT DOCUMENTS

| JP | 8-148623 | 6/1996 |
| JP | 2002-314018 | 10/2002 |

* cited by examiner

*Primary Examiner*—Fernando L Toledo
*Assistant Examiner*—John P Dulka
(74) *Attorney, Agent, or Firm*—McDermott Will & Emery LLP

(57) ABSTRACT

While a semiconductor device is provided with a plurality of element electrodes 5 formed on a semiconductor element 4 and a plurality of lead terminal electrodes 6 formed on a lead frame, the semiconductor device is equipped with a coupling conductor which electrically connects at least one electrode among the above-described element electrodes 5 to at least one electrode among the above-described lead terminal electrodes 6; the above-described coupling conductor is manufactured by a first conductor 1 and a second conductor 2, the major components of which are metals; the first conductor 1 has been electrically connected to the second conductor 2; and the element electrodes 5 and the lead terminal electrodes 6 have been electrically connected to the second conductor 2 respectively.

17 Claims, 8 Drawing Sheets

SEMICONDUCTOR DEVICE INCLUDING A COUPLING CONDUCTOR HAVING A CONCAVE AND CONVEX

BACKGROUND OF THE INVENTION

1. Field of the Invention

The present invention is related to a semiconductor device and a manufacturing method thereof. More specifically, the present invention is directed to a coupling conductor which connects a semiconductor element to a lead terminal, for instance, such a coupling conductor which electrically connects a source electrode of an MOSFET corresponding to one of semiconductor elements with a lead terminal thereof.

2. Description of the Related Art

Very recently, reductions of power consumption of semiconductor devices have been desired. As one of means for reducing the power consumption, various technical ideas capable of lowering ON resistances have been proposed, while the ON resistances correspond to essential resistance components of semiconductor devices when the semiconductor devices are operated. Among these technical ideas, a description is made of techniques capable of reducing ON resistances occupied by packages of semiconductor devices, while these packages protect semiconductor elements and play a role as external connection terminals.

Among manufacturing steps of semiconductor devices, one example of assembling steps is performed as follows: That is, firstly, a semiconductor element cut out from a wafer where desirable element regions and wiring lines have been formed is mounted on an island portion of a lead frame which has been equipped with an island portion (namely, semiconductor element mounting portion) and a lead portion. The lead portion is constructed of a lead terminal manufactured in such a manner that a tip portion of the lead terminal is located in the vicinity of this island portion. Next, an element electrode formed on a surface of the semiconductor element is electrically connected to the lead terminal provided in the vicinity of the circumferential portion of the island portion by employing a coupling conductor such as gold wires and aluminum wires. Thereafter, both the semiconductor element and the lead frame are sealed by a resin, or the like so as to be manufactured in a package form, resulting in a semiconductor device, while a portion of the tip portion of the lead terminal is left. In this case, it is so assumed that a package implies such a component made by combining a lead frame containing a lead with a sealing resin. FIG. 8 is a diagram for representing a semiconductor device of the conventional technique.

In this case, when a coupling conductor called as a bonding wire and made of gold wires, or aluminium wires is employed so as to connect the semiconductor element to the lead, a diameter of a single wire is approximately several tens μm to several hundreds μm. In order to reduce ON resistances, several tens to several hundreds of either gold wires or aluminium wires are necessarily employed, which may cause cost-up aspects, and assembling steps to become complex.

As a consequence, a patent publication 1 has described such a method that a plate-shaped coupling conductor made of copper is employed instead of the metal wires so as to electrically connect a semiconductor element to a lead terminal. In order to electrically connect an element electrode to the lead terminal by employing the coupling conductor, a conductor such as soldering is employed.

Also, a patent publication 2 has described such a method that a plate-shaped coupling conductor made of aluminium is employed so as to electrically connect a semiconductor element to a lead terminal. In order that an element electrode is electrically connected to the lead terminal by the coupling conductor, these electronic components can be connected to each other by performing an ultrasonic connecting method without employing soldering and the like.

Since the plate-shaped coupling conductor made of either copper or aluminium is employed, the ON resistance occupied by the package of the semiconductor device can be reduced, so that such a resistance value lower than, or equal to 1 milliohms can be realized. Moreover, in view of heat radiation characteristics, since thermal conductivity of the above-described plate-shaped coupling conductor becomes higher than that of the gold wires, or the aluminium wires, the heat radiation characteristic from the semiconductor element to the lead frame may be improved, so that a higher current capacity may be realized.

Patent Publication 1: JP-A-8-148623 (page 4, FIG. 1)
Patent Publication 2: JP-A-2002-314018 (page 16, FIG. 2)

However, in such a case that the plate-shaped coupling conductor made of copper is employed, in order to electrically connect the element electrode to the lead terminal, these electronic components must be connected to each other by employing such a conductor as solder. Also, in order that a metal material having a superior solder accepting characteristic must be employed as an element electrode, there is a problem that aluminium which is generally employed as a material of an element electrode cannot be utilized.

On the other hand, although electric conductivity of aluminium is a second higher grade subsequent to copper, this electric conductivity of aluminium is lower than the electric conductivity of copper by approximately 60%. Accordingly, such an aluminium electrode having a plate shape whose thickness is approximately 2 times thicker than a thickness of a copper electrode must be employed. As a result, there is such a demerit that the thickness of the package of the semiconductor device becomes thicker. In addition, since the thermal conductivity of aluminium is lower than that of copper by approximately 60%, there is another demerit that thermal conductivity from the semiconductor element to the lead frame is lowered, as compared with that of copper.

As a consequence, an object of the present invention is to provide a semiconductor device having a coupling conductor, while the coupling conductor is equipped with a function capable of achieving both electric conductivity and thermal conductivity owned by copper, and also, another function capable of simplifying an electric connection between an element electrode and a lead terminal, which is owned by aluminium.

SUMMARY OF THE INVENTION

To achieve the above-described object, a semiconductor device, according to the present invention, is featured by comprising: a semiconductor substrate on which a desirable element region and an element electrode have been formed; a lead portion having a plurality of leads; and a coupling conductor for electrically connecting the element electrode to a lead of the lead portion, the lead corresponding to the element electrode; in which the coupling conductor is comprised of: at least a first conductor, and a second conductor arranged at a region which abuts against either the element electrode or the lead.

As a result, since an arbitrary material can be combined with the above-described coupling conductor, the functions realized by the first conductor and the second conductor can be given to the coupling conductor, namely, the coupling conductor can have a plurality of functions. For example, the function capable of achieving electric conductivity and a mechanical strength can be provided with the first conductor, whereas the function capable of improving a joining strength in a region that abuts against either the element electrode or the lead can be provided with the second conductor.

Also, the present invention is featured by that in the above-described semiconductor device, the coupling conductor contains such a conductor that has been formed by a first conductor and a second conductor stacked on the first conductor at the region that abuts against at least either the element electrode or the lead.

With employment of the above-described structure, even in such a case that the second conductor itself does not have a sufficiently strong strength, the strength of the second conductor can be compensated by the first conductor, so that stronger joining effect can be achieved. Also, the function capable of realizing the higher electric conductivity and the higher thermal conductivity, which are owned by the first conductor, and the function capable of simplifying the electric connection between the element electrode of the semiconductor element and the lead, which are owned by the second conductor, can be provided with respect to the coupling conductor.

Also, the present invention is featured by that in the above-described semiconductor device, the first conductor contains such a conductor that has been formed by a material whose major component is copper.

Also, the present invention is featured by that in the above-described semiconductor device, the second conductor contains such a conductor that has been formed by a material whose major component is aluminium.

Also, the present invention is featured by that in the above-described semiconductor device, the second conductor contains such a conductor that contains at least one sort of a metal selected from aluminium, silver, gold, nickel, and titanium.

Also, the present invention is featured by that in the above-described semiconductor device, either the element electrode or the lead contains an electronic component that has been electrically connected via the second conductor to the coupling conductor respectively by performing an ultrasonic connecting method.

Also, the present invention is featured by that in the above-described semiconductor device, the second conductor contains such a conductor that has a concave and a convex on a surface thereof.

Also, the present invention is featured by that in the above-described semiconductor device, the first conductor contains such a conductor which has a curved plane.

With employment of the above-described structure, when both the element electrode and the lead are electrically connected to the coupling conductor, the first conductor can be formed without electrically being contacted to the semiconductor element.

Also, the present invention is featured by that in the above-described semiconductor device, the coupling conductor contains such a coupling conductor that has been divided into a plurality of sub-divided coupling conductors.

As previously described, since plural pieces of the above-described coupling conductors are employed, both the element electrode and the lead may be electrically connected to these coupling conductors. As a consequence, the coupling conductors can be employed with respect to the element electrode and the lead, which have various sorts of dimensions, so that the cost thereof can be reduced. Also, as compared with such a case that a coupling conductor is formed in such a manner that a width of a single coupling conductor is made wider, since this wide coupling conductor is divided into a plurality of coupling conductors, the following merits may be achieved. That is, these divided coupling conductors can be readily handled; higher bonding characteristics thereof may be obtained; and even when these divided coupling conductors are bent, the bending resistivity thereof may be maintained.

Also, the present invention is featured by such a method for manufacturing a semiconductor device equipped with: a semiconductor substrate on which a desirable element region and an element electrode have been formed; a lead portion having a plurality of leads; and a coupling conductor for electrically connecting the element electrode to a lead of the lead portion, the lead corresponding to the element electrode; in which the semiconductor device manufacturing method is comprised of: a step for sandwiching a second conductor at a region where a coupling conductor equipped with a first conductor and the second conductor abuts against at least the element electrode and the lead, and for joining the coupling conductor in an ultrasonic joining manner.

As a consequence, even when solder, or the like is not employed, the coupling conductor can be connected to both the element electrode and the lead, so that the coupling conductor can be provided with higher electric conductivity and high thermal conductivity. Also, since the step for employing the solder is no longer required, the assembling step can be made simpler. In addition, since the coupling conductor is equipped with the concave/convex shape, the close adhesive characteristic can be increased without increasing the strength during the ultrasonic connecting operation.

As previously described, in accordance with the semiconductor device of the present invention, since the arbitrary material can be combined with the above-described coupling conductor, the functions realized by the first conductor and the second conductor can be given to the coupling conductor, namely, the coupling conductor can have a plurality of functions. For example, the function capable of achieving electric conductivity and the mechanical strength can be given to the first conductor, whereas the function capable of improving the joining strength in the region which abuts against either the element electrode or the lead can be given to the second conductor. As one example, the coupling conductor can be commonly provided with the electric conductivity and the thermal conductivity, which are realized by copper, and the simplification of the electric connection between the element electrode and the lead, which is realized by aluminium.

DESCRIPTION OF THE PREFERRED EMBODIMENTS

Referring now to drawings, a description is made of various embodiment modes of the present invention.

Embodiment Mode 1

Figure 1:
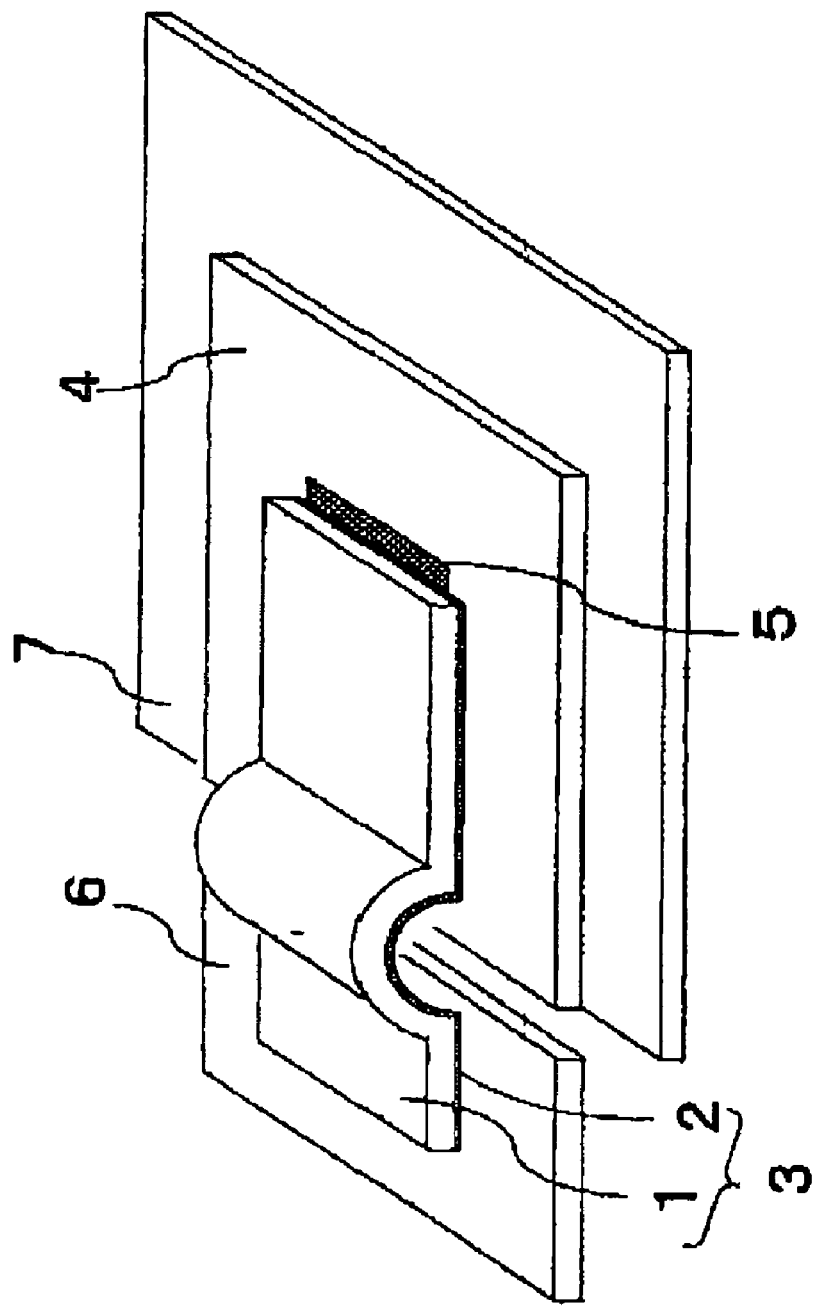
FIG. 1 is a perspective view for showing a semiconductor device equipped with a semiconductor element, a lead frame, and a coupling conductor, according to an embodiment mode 1 of present invention.

FIG. 1 is a perspective view for indicating a semiconductor device according to an embodiment mode 1 of the present invention. In FIG. 1, while a semiconductor element 4 has been electrically connected via a coupling conductor 3 to one end of a lead 6 of a lead frame, a first conductor 1 is a plate-shaped conductor that contains copper as a major component, and a second conductor 2 is an aluminium layer. The aluminium layer is employed in order to electrically connect an element electrode 5 formed on the semiconductor element 4 to the lead 6 of the lead frame. This coupling conductor 3 has been manufactured by stacking the second conductor 2 on one plane of the first conductor 1, and, in FIG. 1, has been formed in a layer shape in such a manner that the first conductor 1 may be electrically connected on the second conductor 2. Although a plane of the second conductor 2 provided on the side to be electrically connected to the lead 6 is plain, concave/convex portions may be alternatively formed on this plane of the second conductor 2. The semiconductor element 4 has been formed on a semiconductor element mounting portion 7 which corresponds to an island-shaped electrode of the lead frame. It should be understood that the semiconductor element 4 has been electrically connected to the semiconductor element mounting portion 7 via a conductor such as solder.

Since the second conductor 2 has been made of aluminium, the second conductor 2 can be electrically connected to both the element electrode 5 and the lead 6 by utilizing an ultrasonic connecting method. As a consequence, the coupling conductor 3 has two functions, namely, a function of high electric conductivity and a thermal conducting characteristic, which are provided by the first conductor 1; and another function capable of simplifying an electric connection that is provided by the second conductor 2. As a result, an ON resistance occupied by a package of the semiconductor device when the semiconductor element 4 is operated can be reduced, and further, heat generated from the semiconductor element 4 can be externally radiated in a higher efficiency. Also, when the coupling conductor 3 is employed so as to electrically connect the element electrode 5 to the lead 6, since these electric components can be easily joined to each other by utilizing an ultrasonic joining method, as compared with such a case that a solder joining method is employed, the treating method can be made simpler.

It should also be noted that this coupling conductor 3 is manufactured in such a manner that aluminium foil whose thickness is approximately 0.05 mm is joined on a copper plate whose thickness is approximately 0.1 mm, and then, the resulting copper plate is cut into a desirable shape. Aluminium has such a feature that an ultrasonic joining method can be easily applied and a superior treating characteristic can be achieved. Copper has such a feature that an electric conductive characteristic thereof is high, and also, a mechanical strength thereof is high.

Alternatively, an aluminium thin film functioning as the second conductor 2 may be formed on a copper plate functioning as the first conductor 1 by executing a thin-film forming method such as a sputtering method and a CVD (Chemical Vapor Deposition) method.

While the semiconductor device according to the embodiment mode 1 of the present invention has been described, the present invention is not limited only to this embodiment mode.

For instance, in the above-described embodiment mode 1, the aluminium layer has been employed as the second conductor 2. Alternatively, other metals may be employed, for instance, a metal whose major component is aluminium, silver, gold, nickel, titanium, and the like may be employed. As the second conductor 2, such a conductor may be desirably employed, the melting point of which is low, and which may be easily joined by utilizing an ultrasonic joining method. However, if such a material has a superior close adhesive characteristic with respect to either the lead 6 or the element electrode 4, then this material may be alternatively employed. If necessary, solder may be alternatively interposed between the second conductor 2 and either the lead 6 or the element electrode 5.

Also, the first conductor 1 has been formed over the entire upper plane of the second conductor 2. However, if the first conductor 1 has been electrically connected to the second conductor 2, then a portion of the first conductor 1 may be alternatively exposed to the lower plane of the second conductor 2. Also, although the second conductor 2 has been electrically connected to the first conductor 1 over the entire plane thereof, a portion of the second conductor 2 may not be electrically connected to the first conductor 1. In addition, only the first conductor 1 may be alternatively located at a portion of the coupling conductor 3.

Also, in the above-described embodiment mode 1, the coupling conductor 3 has been constructed in such a manner that this coupling conductor 3 has the curved shape. Alternatively, the shape of the coupling conductor 3 may be formed in a straight line. For example, in such a case that the semiconductor element mounting portion 7 has been arranged at a position lower than the edge plane of the lead 6, and a height of the element electrode 5 is identical to a height of the lead 6, the coupling conductor 3 does not constitute the curved plane, but may constitute a flat plane.

Embodiment Mode 2

Figure 2:
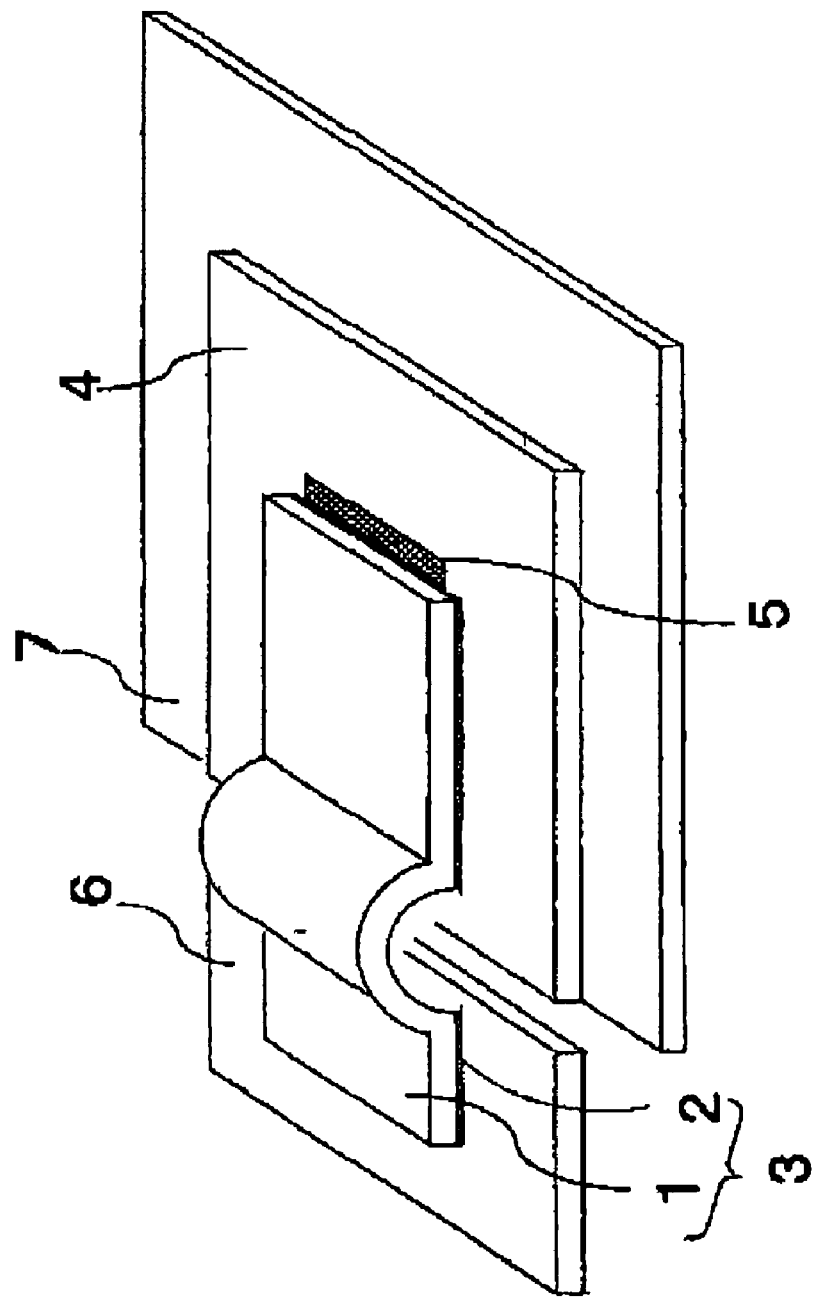
FIG. 2 is a perspective view for showing a semiconductor device equipped with a semiconductor element, a lead frame, and a coupling conductor, according to an embodiment mode 2 of present invention.

FIG. 2 is a schematic diagram of a semiconductor device according to an embodiment mode 2 of the present invention. A structural difference from that of the above-described embodiment mode 1 is given as follows: That is, a second conductor 2 constructed of an aluminium layer has been provided with respect only to such a region which is electrically connected to both an element electrode 5 and a lead 6 by performing an ultrasonic connecting method. It should be understood that in the below-mentioned embodiment mode 2, the same reference numerals will be employed as those for denoting the same structural elements explained in the embodiment mode 1, and detailed descriptions thereof will be omitted.

In accordance with the above-described structure, in addition to the operation effects achieved by the above-described embodiment mode 1, since a portion that becomes a curved shape is a layer structure of a first conductor 1, a mechanical strength can be maintained, while stripping of the first conductor 1 does not occur due to folding operation.

Also, the portion that becomes the curved shape is the layer of the first conductor 1, namely is thin, a shape treatment of this layer of the first conductor 1 can be readily carried out.

It should also be noted that this coupling conductor 3 is manufactured in such a manner that aluminium foil whose thickness is approximately 0.05 mm is joined on a copper plate whose thickness is approximately 0.1 mm; the resulting copper plate is patterned by employing a photolithography so as to be formed in such a manner that a portion of the aluminium foil is left; and thereafter, the resulting copper plate is cut to obtain a desirable shape.

Alternatively, the aluminium layer may be formed on the copper plate by employing a thin-film forming method, or by employing a plating method. Since a selective plating method is employed, the manufacturing steps can be simplified.

Embodiment Mode 3

Figure 3:
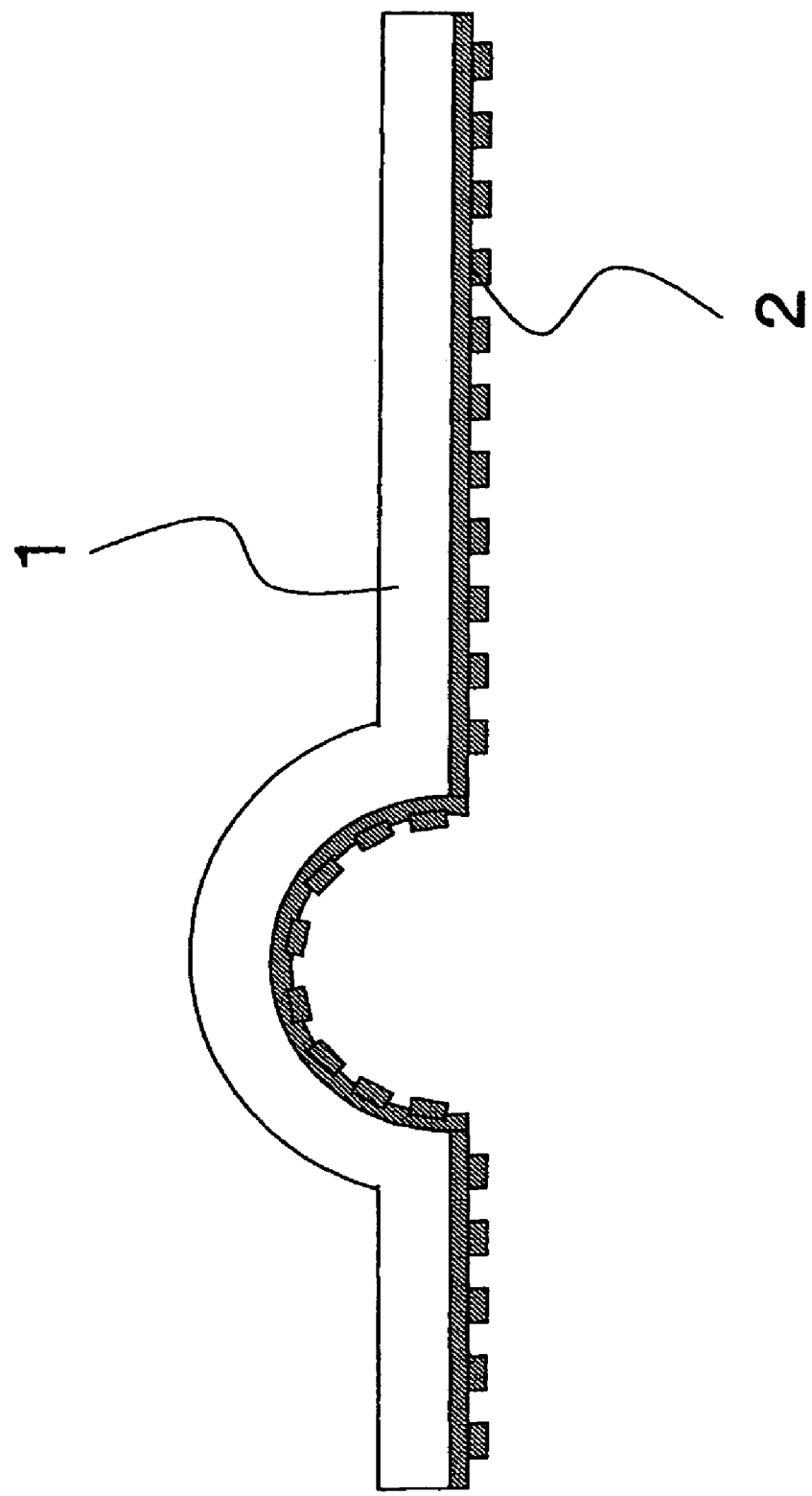
FIG. 3 is a schematic diagram for indicating a coupling conductor according to an embodiment mode 3 of the present invention.

FIG. 3 is a schematic diagram of a coupling conductor that is employed in order to mount a semiconductor device according to an embodiment mode 3 of the present invention. It should be understood that in the below-mentioned embodiment mode 3, the same reference numerals will be employed as those for denoting the same structural elements explained in the embodiment mode 1, and detailed descriptions thereof will be omitted.

Figure 4:
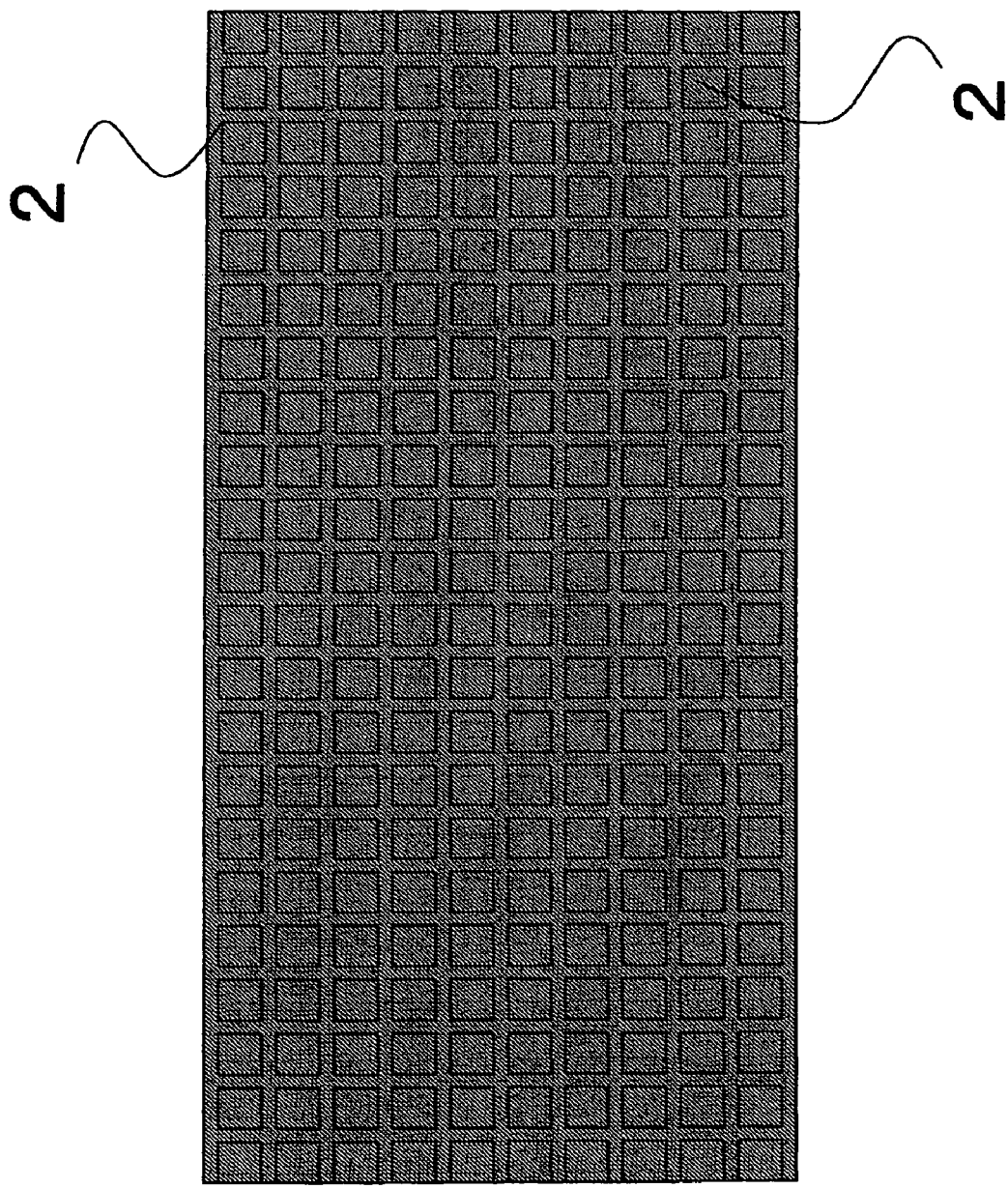
FIG. 4 is another schematic diagram for showing the coupling conductor according to the embodiment mode 3 of the present invention.

In FIG. 3, a second conductor 2 has been formed by such a conductor having a plate shape made of combining concaves/convexes, curved planes, and flat planes with each other. FIG. 4 is a plan view of the above-described second conductor 2, as viewed from the side for forming the second conductor 2. In this embodiment mode 3, more specifically, the plate-shaped conductor having the concave/convex shape is employed in such a region which the second conductor 2, the element electrode 5, and the lead 6 are electrically connected. As a result, a close adhesive characteristic when these structural elements are connected by performing an ultrasonic connecting method can be increased. For example, if an area of a surface having concaves/convexes is made two times larger than an area of a surface that does not have the concaves/convexes, then a close adhesive characteristic as to the area of the surface having the concaves/convexes may be increased approximately two times than that of the area having no concave/convex. Otherwise, even if a strength of ultrasonic waves during the ultrasonic connecting operation is decreased, a close adhesive characteristic can be secured. As a result, shocks of the ultrasonic waves given to the semiconductor element 4 can be suppressed, so that an adverse influence given to the electric characteristic thereof can be reduced.

While the semiconductor device according to the embodiment mode 3 of the present invention has been described, the present invention is not limited only to this embodiment mode.

For example in the embodiment mode 3, as shown in FIG. 4, the second conductor 2 has been formed by the plate-shaped conductor having rectangular grid-shaped concaves/convexes. Alternatively, the second conductor 2 may be formed by employing a circular shape, a non-circular shape, a polygon, geometrical patterns formed in a disordered manner, or the like. Also, the first conductor 1 is not directly contacted within such a region that the second conductor 2, the element electrode 5, and the lead 6 are contacted to each other. However, the first conductor 1 may be alternatively formed in such a manner that this first conductor 1 is directly contacted to the second conductor 2, the element electrode 5, and the lead 6. Even in this alternative case, a close adhesive characteristic achieved during an ultrasonic connecting operation may be increased.

It should also be understood that this concave/convex may be alternatively formed only on a portion, for example, such an area that the second conductor 2, the element electrode 5, and the lead 6 are contacted to each other. Also, the concave/convex may be alternatively formed to have such a shape whose tip portion is projected.

Embodiment Mode 4

Figure 5:
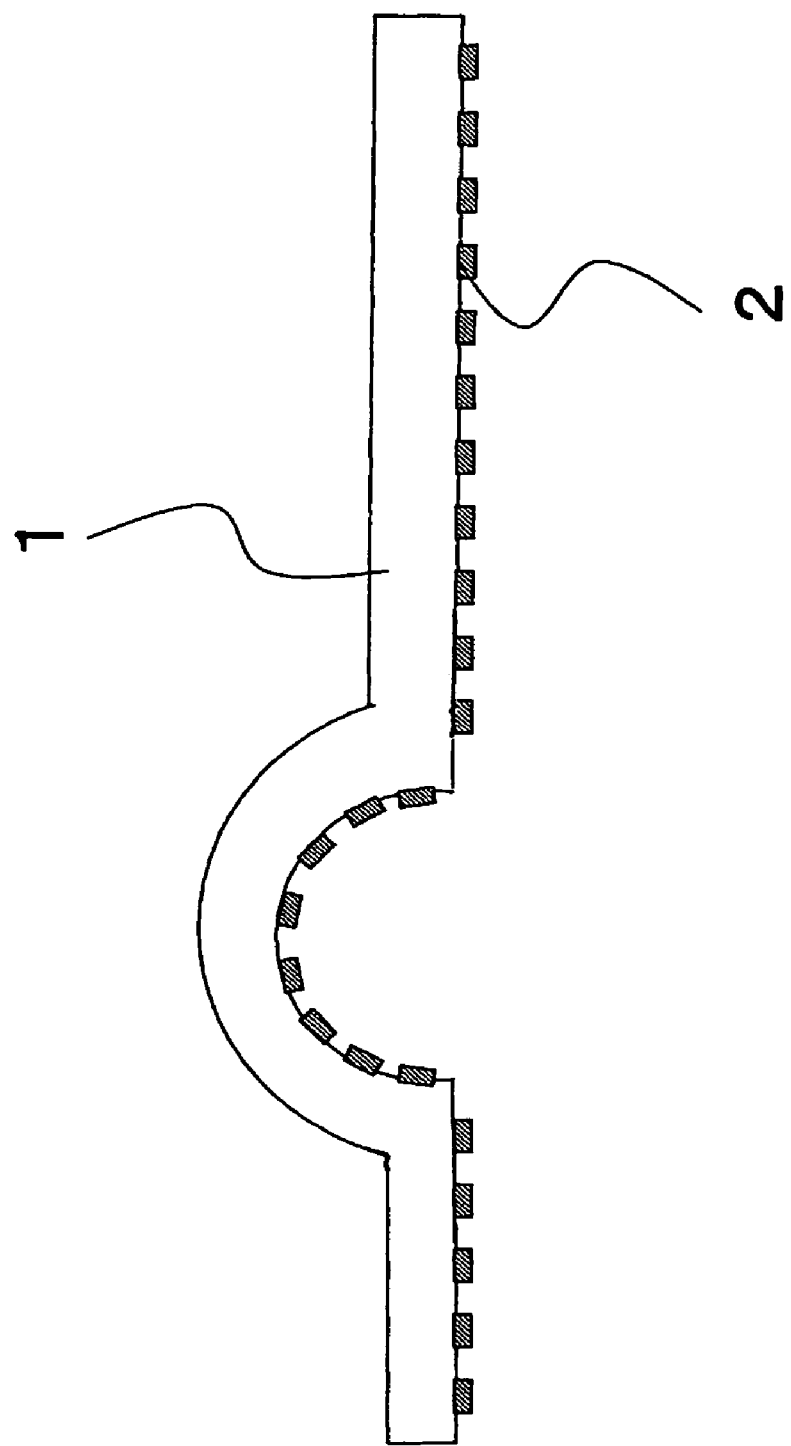
FIG. 5 is a schematic diagram for indicating a coupling conductor according to an embodiment mode 4 of the present invention.
Figure 6:
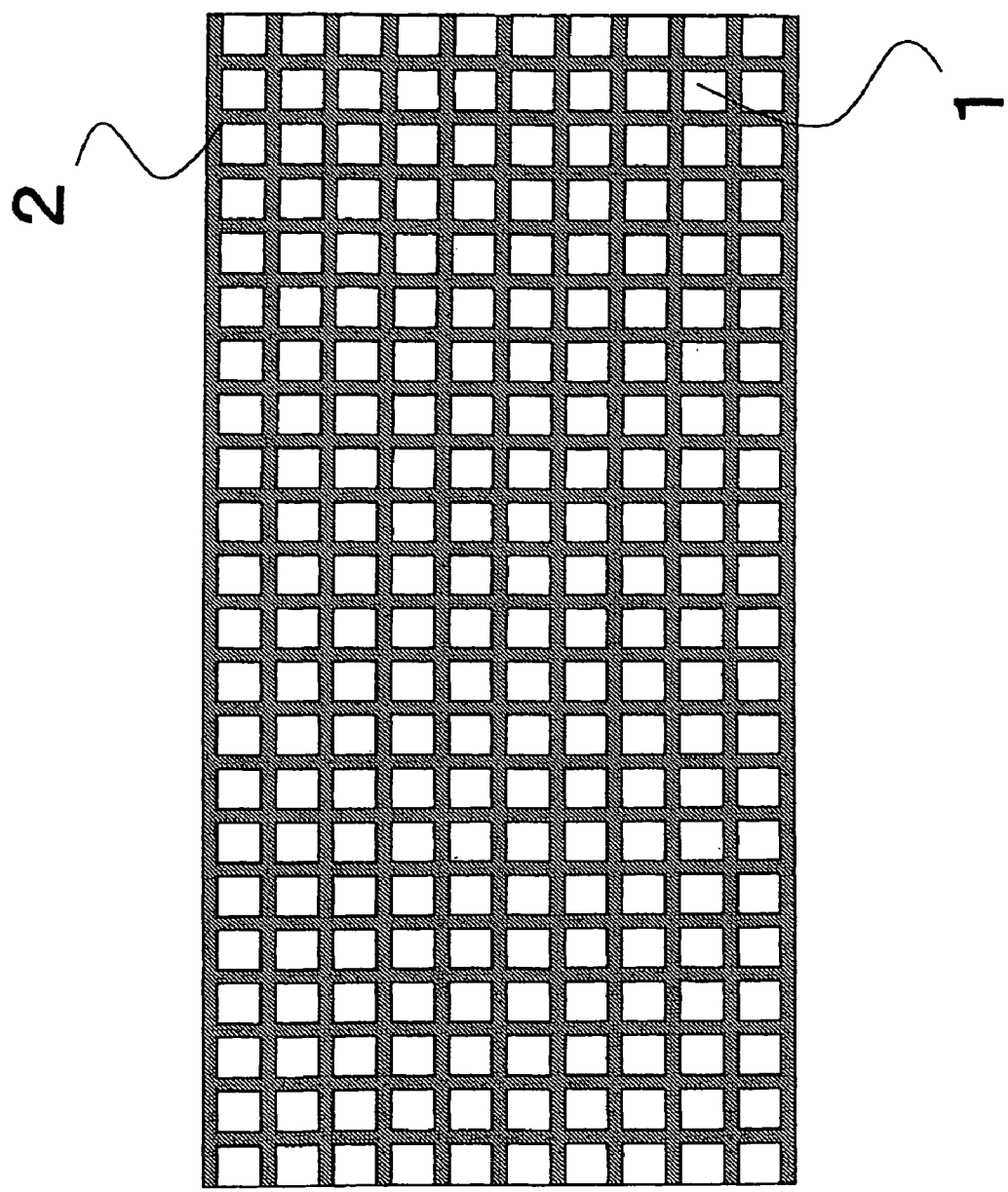
FIG. 6 is another schematic diagram for showing the coupling conductor according to the embodiment mode 4 of the present invention.

FIG. 5 is a schematic diagram of a coupling conductor which is employed in order to mount a semiconductor device according to an embodiment mode 4 of the present invention. FIG. 6 is a plan view of the coupling conductor, as viewed from a joining plane side. A structural difference from that of the above-described embodiment mode 3 is given as follows: That is, in the embodiment mode 4, a portion of a first conductor 1 has been formed to be exposed to a joining plane, and furthermore, a second conductor 2 has been formed in such a manner that this second conductor 2 constitutes a pattern shape which is projected from the surface of the first conductor 1. It should be understood that in the below-mentioned embodiment mode 4, the same reference numerals will be employed as those for denoting the same structural elements explained in the embodiment mode 3, and detailed descriptions thereof will be omitted.

In the above-described embodiment mode 3, the first conductor 1 has not been directly contacted within such a region that the second conductor 2, the element electrode 5, and the lead 6 have been contacted to each other. However, in this embodiment mode 4, in the region where the coupling conductor 3, the element electrode 5, and the lead 6 are contacted to each other, the second conductor 2 has been formed to constitute a pattern shape. Since a portion of the first conductor 1 has been exposed to the joining plane, the second conductor 2 may be melted by being irradiated by ultrasonic waves, so that a contact characteristic among the first conductor 1, the element electrode 5, and the lead 6 can be increased.

Embodiment Mode 5

Figure 7:
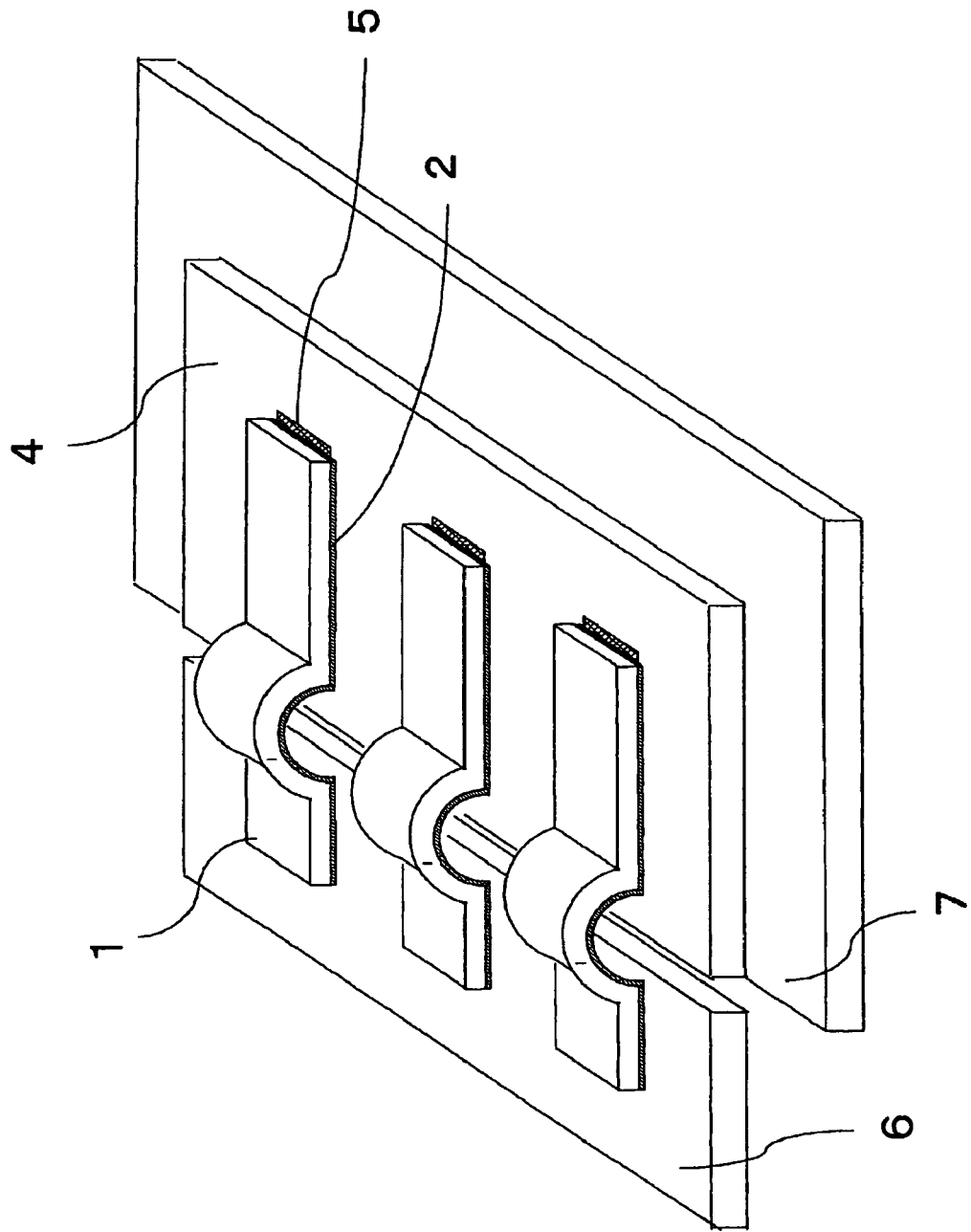
FIG. 7 is a perspective view for showing a semiconductor device equipped with a semiconductor element, a lead frame, and a coupling conductor, according to an embodiment mode 5 of present invention.
Figure 8:
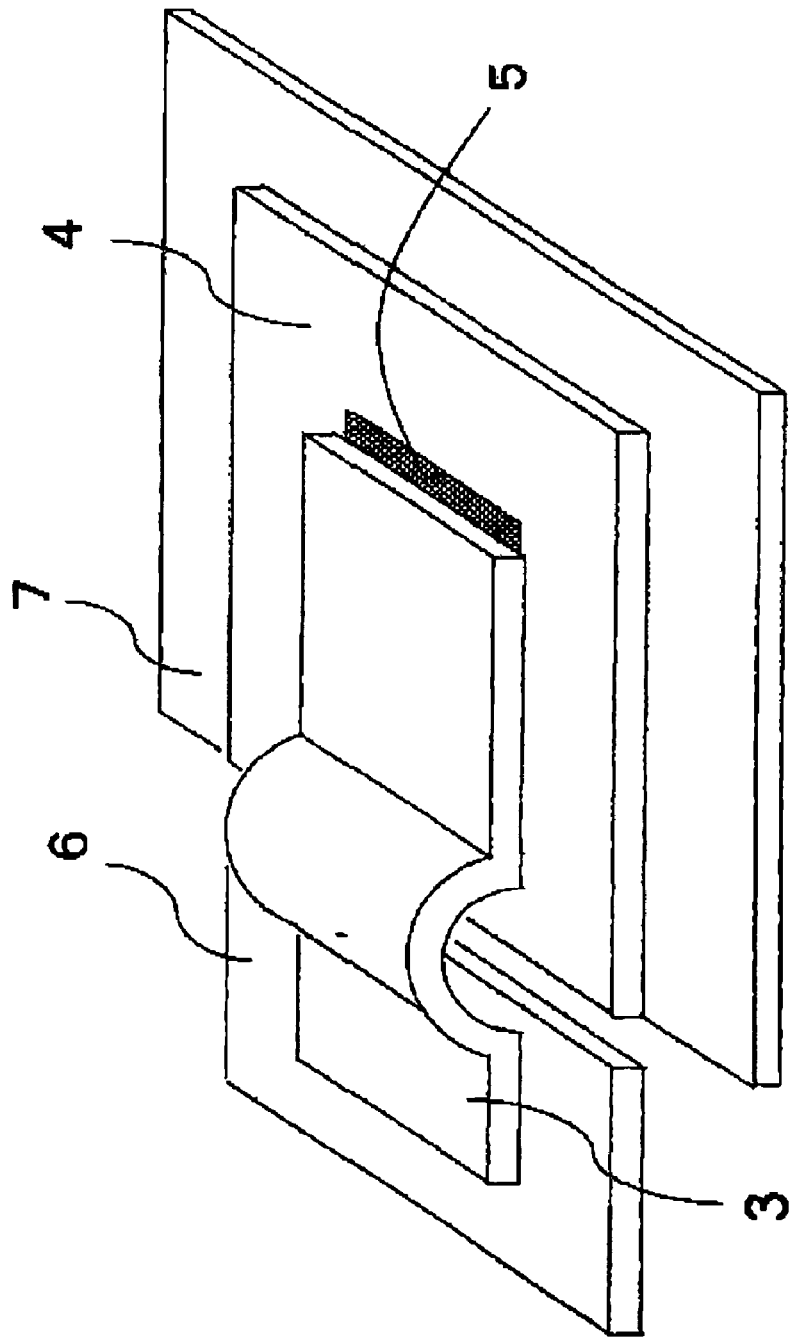
FIG. 8 is a perspective view for schematically representing the connection structure of the semiconductor element 4, the coupling conductor 3, and the lead terminal 6 in the conventional semiconductor device.

FIG. 7 is a perspective view of a semiconductor device according to an embodiment mode 5 of the present invention. It should be understood that in the below-mentioned embodiment mode 5, the same reference numerals will be employed as those for denoting the same structural elements explained in the embodiment mode 1, and detailed descriptions thereof will be omitted.

In FIG. 7, a coupling conductor 3 is electrically connected to both an element electrode 5 and a lead 6 by employing a plurality of coupling conductors 3. As a result, even for such element electrodes 5 having various sorts of areas, one sort of coupling conductor 3 may be properly employed, so that cost of the plural coupling conductors 3 can be reduced, and stock of the plural coupling conductors 3 can be reduced.

Also, as compared with such a case that a coupling conductor is formed in such a manner that a width of a single coupling conductor is made wider, since this wide coupling conductor is divided into a plurality of coupling conductors, the following merits may be achieved. That is, these divided coupling conductors can be readily handled; higher bonding characteristics thereof may be obtained; and even when these divided coupling conductors are bent, the bending resistivity thereof may be maintained.

While the semiconductor device according to the embodiment mode 5 of the present invention has been described, the present invention is not limited only to this embodiment mode.

For example, in the embodiment mode 5, in FIG. 7, a total number of the above-described coupling conductors 3 has been selected to be 3. Alternatively, one pieces, or more pieces of these coupling conductors 3 may be employed. Although the plurality of coupling conductors 3 have been connected parallel to each other in an equi-interval, these coupling conductors 3 need not be connected in the equi-interval, but also need not be connected parallel to each other.

Since the coupling conductor having the low resistance value and having the high joining strength is constructed by the present invention, the present invention can be applied to a power device through which a large current flows, more specifically, the inventive idea of the present invention may become advantageous when a source electrode of the power device and a lead thereof are connected by the above-described coupling conductor.

What is claimed is:

1. A semiconductor device, comprising:
   a semiconductor substrate on which a desirable element region and an element electrode have been formed;
   a lead portion having a plurality of leads; and
   a coupling conductor electrically connecting said element electrode to a lead of said lead portion, said lead corresponding to said element electrode,
   wherein said coupling conductor is comprised of at least a first conductor, and a second conductor extending from said element electrode to said lead portion,
   the second conductor is provided on a surface of the first conductor,
   said first conductor has been formed by a material whose major component is copper, and
   said second conductor has a concave and a convex on at least portions of a surface of said second conductor positioned at said element electrode and said lead portion, and on at least a portion of the surface of said second conductor positioned between said element electrode and said lead portion.

2. The semiconductor device as claimed in claim 1, wherein the coupling conductor has been formed by a first conductor and a second conductor stacked on said first conductor at the region which abuts against at least either said element electrode or said lead.

3. The semiconductor device as claimed in claim 1, wherein said second conductor has been formed by a material whose major component is aluminium.

4. The semiconductor device as claimed in claim 1, wherein said second conductor contains at least one sort of a metal selected from aluminium, silver, gold, nickel, and titanium.

5. The semiconductor device as claimed in claim 1, wherein said first conductor has a curved plane.

6. The semiconductor device as claimed in claim 1, wherein said coupling conductor has been divided into a plurality of sub-divided coupling conductors.

7. The semiconductor device as claimed in claim 1, wherein the second conductor is formed over an entire surface of one side of the first conductor.

8. The semiconductor device as claimed in claim 7, wherein said second conductor has been formed by a material whose major component is aluminium.

9. The semiconductor device as claimed in claim 7, wherein said second conductor contains at least one sort of a metal selected from aluminium, silver, gold, nickel, and titanium.

10. The semiconductor device as claimed in claim 7, wherein said first conductor has a curved plane.

11. The semiconductor device as claimed in claim 7, wherein said coupling conductor has been divided into a plurality of sub-divided coupling conductors.

12. A semiconductor device, comprising:
    a semiconductor substrate on which a desirable element region and an element electrode have been formed;
    a lead portion having a plurality of leads; and
    a coupling conductor electrically connecting said element electrode to a lead of said lead portion, said lead corresponding to said element electrode,
    wherein said coupling conductor is comprised of at least a first conductor, and a second conductor extending from said element electrode to said lead portion,
    the first conductor has been formed by a material whose major component is copper,
    the second conductor is provided on a surface of the first conductor,
    at least portions of the first conductor positioned at said element electrode and said lead portion, and at least a portion of the first conductor positioned between said element electrode and said lead portion, are exposed from the second conductor.

13. The semiconductor device as claimed in claim 12, wherein the coupling conductor has been formed by a first conductor and a second conductor stacked on said first conductor at the region which abuts against at least either said element electrode or said lead.

14. The semiconductor device as claimed in claim 12, wherein said second conductor has been formed by a material whose major component is aluminium.

15. The semiconductor device as claimed in claim 12, wherein said second conductor contains at least one sort of a metal selected from aluminium, silver, gold, nickel, and titanium.

16. The semiconductor device as claimed in claim 12, wherein said first conductor has a curved plane.

17. The semiconductor device as claimed in claim 12, wherein said coupling conductor has been divided into a plurality of sub-divided coupling conductors.

* * * * *